United States Patent
Park et al.

(10) Patent No.: US 7,486,091 B2
(45) Date of Patent: Feb. 3, 2009

(54) TEST UNIT USABLE WITH A BOARD HAVING AN ELECTRONIC COMPONENT

(75) Inventors: Tae-sang Park, Seoul (KR); Jung-soon Kim, Suwon-si (KR); Young-jun Moon, Suwon-si (KR); Jun-young Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 160 days.

(21) Appl. No.: 11/316,930

(22) Filed: Dec. 27, 2005

(65) Prior Publication Data

US 2006/0139044 A1 Jun. 29, 2006

(30) Foreign Application Priority Data

Dec. 28, 2004 (KR) ...................... 10-2004-0113918

(51) Int. Cl.
*G01R 31/02* (2006.01)
(52) U.S. Cl. .................. 324/763; 324/755; 324/765
(58) Field of Classification Search ........................ None
See application file for complete search history.

(56) References Cited

U.S. PATENT DOCUMENTS

| | | | | |
|---|---|---|---|---|
| 5,656,863 A | * | 8/1997 | Yasunaga et al. | 257/778 |
| 5,767,528 A | * | 6/1998 | Sumi et al. | 257/48 |
| 5,811,980 A | * | 9/1998 | Doyle et al. | 324/758 |
| 5,986,460 A | * | 11/1999 | Kawakami | 324/765 |
| 6,586,843 B2 | * | 7/2003 | Chen et al. | 257/778 |
| 6,774,640 B2 | | 8/2004 | Li | |
| 6,937,043 B2 | * | 8/2005 | Okubo | 324/755 |

FOREIGN PATENT DOCUMENTS

| | | |
|---|---|---|
| JP | 4-123452 | 4/1992 |
| JP | 4-251949 | 9/1992 |
| KR | 1988-21037 | 11/1988 |
| KR | 1997-3713 | 1/1997 |

OTHER PUBLICATIONS

Korean Office Action dated May 10, 2006 issued in KR 2004-113918.

* cited by examiner

*Primary Examiner*—Minh N Tang
(74) *Attorney, Agent, or Firm*—Stanzione & Kim, LLP

(57) ABSTRACT

A test unit usable with a board having, an electronic component includes at least one testing point provided in each electronic component to test electric properties and a connection state of the plurality of electronic components connected to the board. The test unit usable with a PCB having the electronic component includes a testing point formed on the electronic component, thereby an enhancing high integration of the board.

20 Claims, 4 Drawing Sheets

TEST UNIT USABLE WITH A BOARD HAVING AN ELECTRONIC COMPONENT

CROSS-REFERENCE TO RELATED APPLICATIONS

This application claims under 35 U.S.C. §119 the benefit of Korean Patent Application No. 2004-113918, filed on Dec. 28, 2004, in the Korean Intellectual Property Office, the disclosure of which is incorporated herein by reference.

BACKGROUND OF THE INVENTION

1. Field of the Invention

The present general inventive concept relates to a test unit of a printed circuit board (PCB) mounted with an electric component, and more particularly, to a test unit of a PCB with an electronic component, in which the electronic component comprises a testing point.

2. Description of the Related Art

Generally, various electronic components, such as a memory chip or the like, are mounted on a circuit board, and a testing point for the electronic component is formed on the circuit board.

An example of the testing point provided in the circuit board with the electronic components is disclosed in Korean Utility Model Application Laid-open Nos. 1997-3713 and 1988-21037.

FIG. 1 is a perspective view of a conventional board 120 with electronic components. As shown in FIG. 1, a conventional board 120 comprises a plurality of electronic components 110, and a plurality of testing points 105 formed on the conventional board 120 to be electrically connected to connection pins (not shown) provided in the electronic components 110 so as to test the electronic components 110.

Thus, a user can test the electronic component 110 through the testing point 105 provided on the board 120 and determine whether the electronic component 110 is defective or not according to the testing results.

However, since the conventional board 120 comprises the plurality of testing points 105 to test the electronic components 110, it is difficult to make the board 120 have high integration by decreasing a size of the testing points. Accordingly, there is needed to reduce or eliminate the testing points 105, thereby testing the electronic components mounted on the board 120 properly.

SUMMARY OF THE INVENTION

The present general inventive concept provides a test unit usable with a circuit board having an electronic component, in which the electronic component comprises a testing point, thereby enhancing high integration of the circuit board.

The present general inventive concept provides a unit to directly cool a plurality of heat generating unit having the test point by blowing external air through the test point of the heat generating unit, thereby increasing a cooling efficiency of the heat generating unit.

Additional aspects and/or advantages of the general inventive concept will be set forth in part in the description which follows and, in part, will be obvious from the description, or may be learned by practice of the general inventive concept.

The foregoing and/or other aspects of the present general inventive concept may be achieved by providing a test unit usable with a board having an electronic component, the test unit comprising at least one testing point provided on the electronic component to test electric properties and a connection state of the electronic component connected to the board.

The testing point is electrically connected to a connection pin provided in the electronic component.

The electronic component comprises at least one of an active component having at least tree connection pins and a passive component having two connection pins.

The testing point is placed on an opposite side to a side of the electronic component facing the board.

The foregoing and/or other aspects of the present general inventive concept may also be achieved by providing an electronic component comprising a main body containing a main circuit component, a connection pin connected to the main circuit component and exposed to an outside of the main body, and at least one testing point formed on the main body, connected to the main circuit component, and exposed to an outside of the main body.

The foregoing and/or other aspects of the present general inventive concept may also be achieved by providing a circuit board comprising a board connection portion formed on a surface of the circuit board, and an electronic component electrically connected to the board connection portion and comprising a main body containing a main circuit component, a connection pin connected to the main circuit component and exposed to an outside of the main body to be connected to the board connection portion, and at least one testing point formed on the main body, connected to the connecting pin, and exposed to an outside of the main body provided in the electronic component to test an electric property and a connection state of the electronic component connected to the board.

BRIEF DESCRIPTION OF THE DRAWINGS

These and other aspects and advantages of the present general inventive concept will become apparent and more readily appreciated from the following description of the embodiments, taken in conjunction with the accompany drawings of which.

DETAILED DESCRIPTION OF THE PREFERRED EMBODIMENTS

Figure 1:
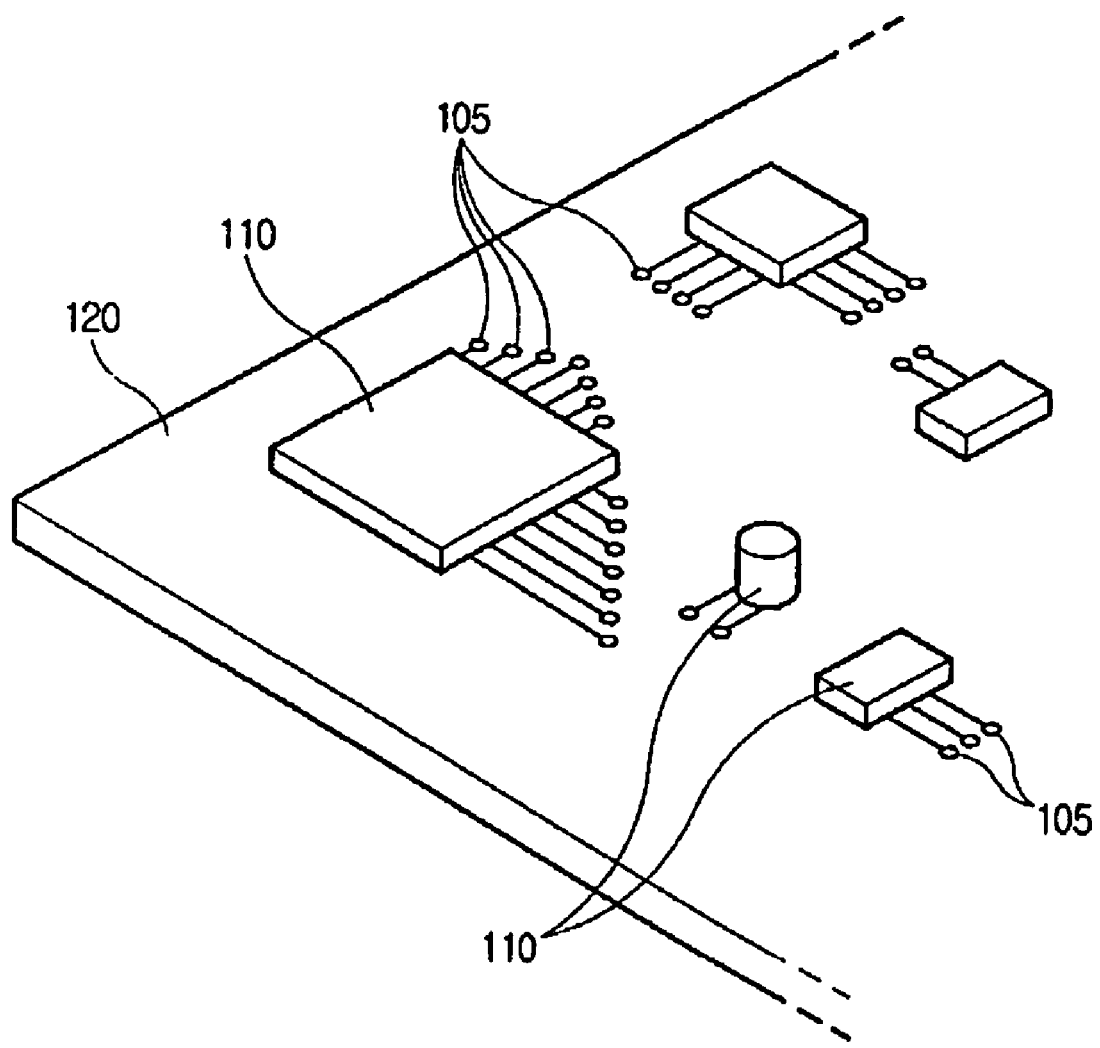
FIG. 1 is a perspective view of a conventional board having an electric component.

Reference will now be made in detail to the embodiments of the present general inventive concept, examples of which are illustrated in the accompanying drawings, wherein like reference numerals refer to like elements throughout. The embodiments are described below so as to explain the present general inventive concept by referring to the figures.

Figure 2:
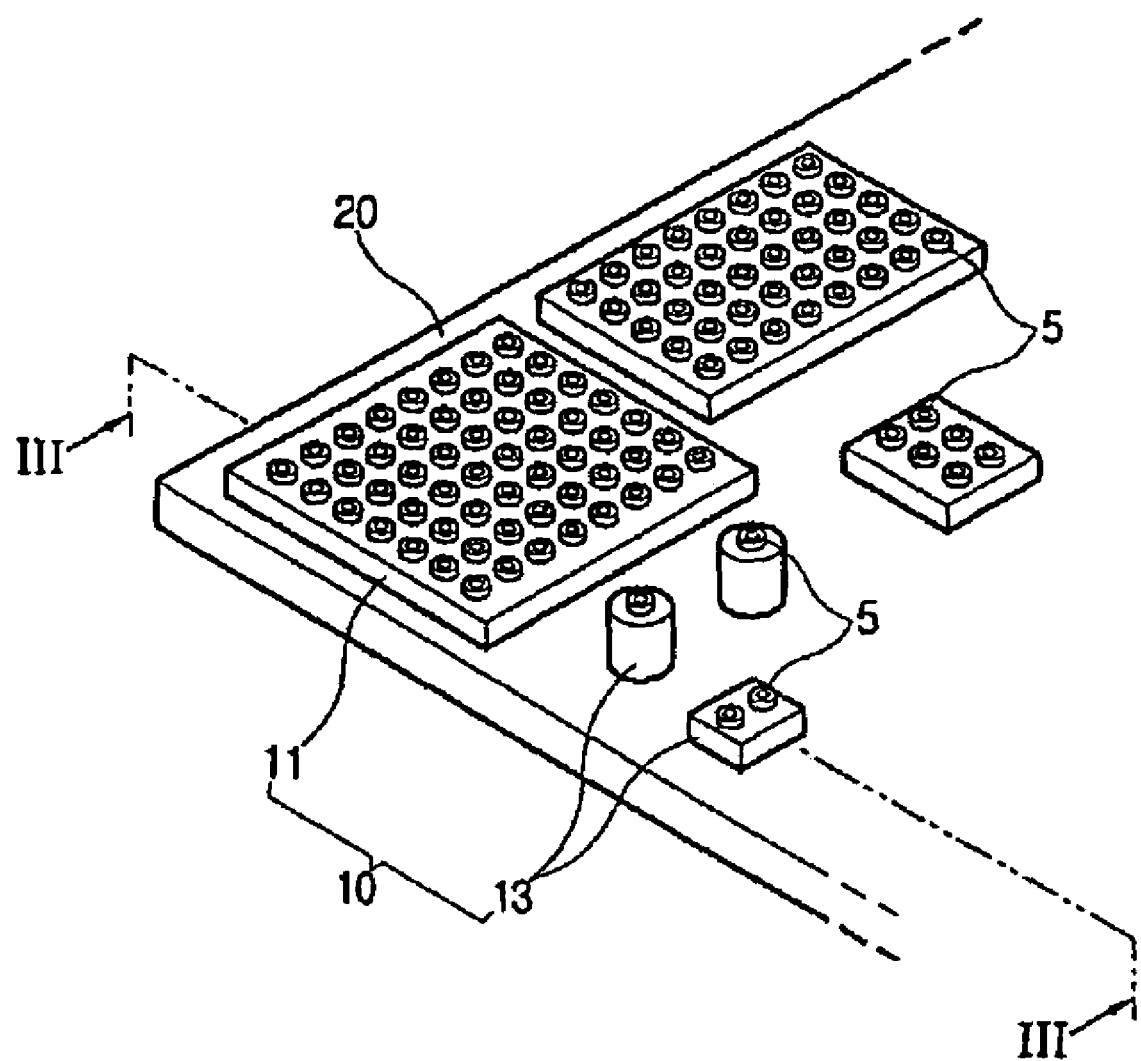
FIG. 2 is a perspective view of a board having electronic components comprising a test unit according to an embodiment of the present general inventive concept.
Figure 3:
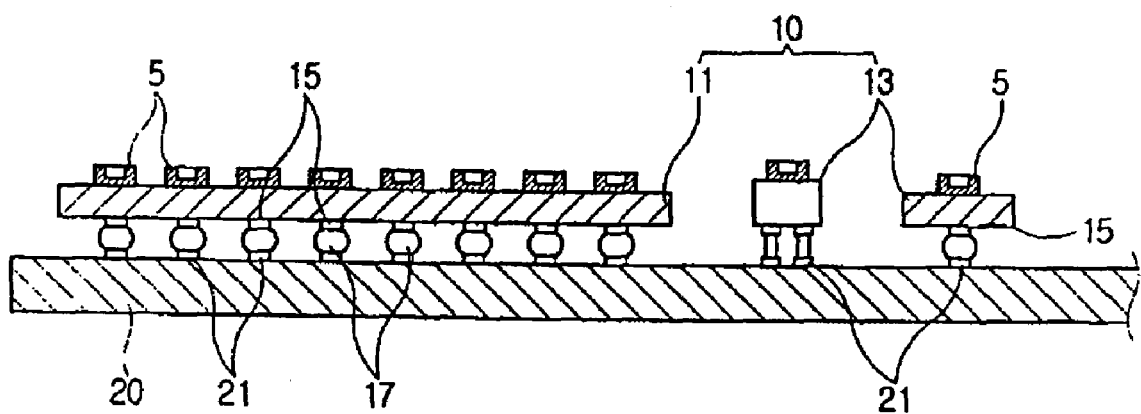
FIG. 3 is a partial cross-sectional view of the board having the electronic component formed with the test unit along a line III-III of FIG. 2.

As shown in FIGS. 2 and 3, a testing unit according to an embodiment of the present general inventive concept comprises at least one testing point 5 provided in an electronic (or electric) component 10 to test properties and connection state of the electronic component 10 connected to a circuit board, such as a printed circuit board (PCB) 20.

The PCB 20 comprises a plurality of board connection portions 21 and a circuit pattern (not shown). The plurality of board connection portions 21 can be connected with connection pins 15 of the electronic components 10 (to be described later), and the circuit pattern can be electrically connect the plurality of board connection portions 21 to form a circuit.

The electronic component 10 comprises the connection pins 15 to be connected with the board connection portions 21 of the PCB 20. The electronic component 10 may be variously shaped like a memory chip, an integrated circuit, or the like, and may be an active component 11 and a passive component 13 according to sizes, functions, etc.

The active component 11, such as the memory chip, can be formed by a dual in-line package (DIP), a quad flat package (QFP), a ball grid array (BGA) package, etc., can occupy relatively large spaces of the PCB 20, and can include three or more connection pins 15 to be connected with the PCB 20. Hereinbelow, the BGA package will be described as an example of the active component 11. As shown in FIG. 3, the active component 11 comprises a plurality of connection pins 15 and at least one testing point 5 corresponding to the board connection portions 21. The connection pins 15 of the active components 11 are placed on a bottom side of the active component 11 to be electrically connected to corresponding ones of the board connection portions 21 using solder balls 17. Alternatively, the electric connection between the connection pin 15 of the active component 11 and the board connection portion 21 of the PCB 20 is not limited to the solder ball 17, and may be achieved by various methods.

The passive component 13, such as a resistor, a condenser, etc., occupies relatively small space of the PCB 20, and comprises two or less connection pins 15. As shown in FIG. 3 the passive component 13 comprises a pair of connection pins 15 and at least one testing point 5 corresponding to the board connection portions 21. The connection pins 15 of the passive components 13 are placed on a bottom side of the passive component 13 to be electrically connected to corresponding ones of the board connection portions 21 by soldering. Alternatively, the electric connection between the connection pin 15 of the passive component 13 and the board connection portion 21 of the PCB 20 is not limited to the soldering, and may be achieved by various methods.

Figure 4:
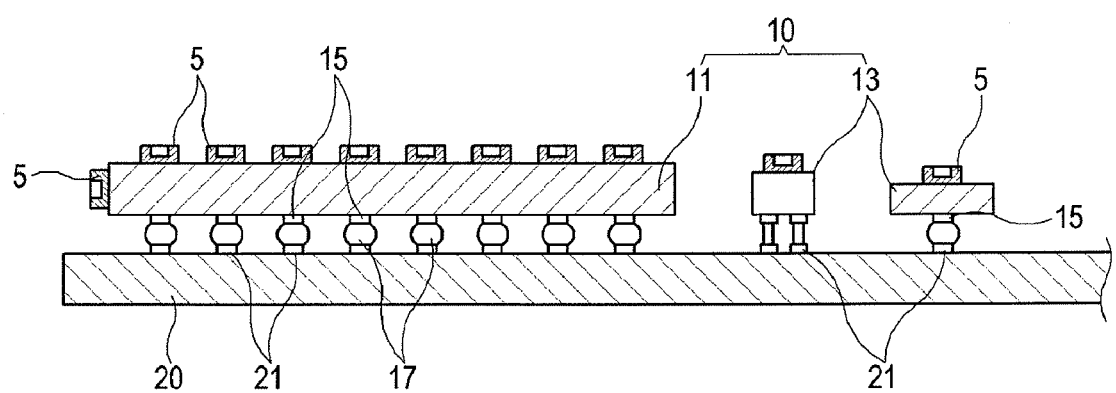
FIG. 4 is a cross-sectional view of the board having a test unit being formed on a lateral side of the electronic component.

The testing point 5 is electrically connected to the connection pin 15 of the electric component 10 so as to test the electric properties and the connection state of the electronic component 10. The testing point 5 is placed on an opposite side to the bottom side of the electronic component 10 formed with the connection pin 15, thereby allowing a user to easily test the electronic component 10. That is, the testing point 5 is placed on the opposite side to a side of the electronic component 10 facing the PCB 20. However, the position of the testing point 5 is not limited to the opposite side to the side of the electronic component 10 facing the PCB 20, and may include various sides such as lateral sides, as illustrated in FIG. 4. or the like. According to an embodiment of the present invention, a plurality of testing points 5 are arranged like a latticed shape on a top surface of the active component 11. Alternatively, a single testing point 5 may be provided on the top surface of the active component 11. According to an embodiment of the present general inventive concept, a single testing point 5 can be provided on the top surface of the passive component 13. Alternatively, the plurality of testing points 5 may be provided on the top surface of the passive component 13. The testing point 5 can be provided as a hole formed on the electronic component 10, thereby allowing a user to easily test resistance or the like using an ohmmeter or the like. Alternatively, the testing point 5 may have various shapes such as a flat pad, a protruding pin, etc.

That is, the testing point 5 includes a conductive line connected to at least one of the connecting pin 15 and a main circuit component packaged in the electronic component 10, and a portion through which the conductive conduct is exposed such that the electronic component 10 is tested through the testing point 5. Accordingly, a user can insert a conductive line of a testing apparatus to connect the conductive line of the testing apparatus to the conductive line of the testing point 5 such that the testing apparatus can detect a state of the electronic component 10 or determine whether the electronic component 10 is defective through the testing point 5.

With this configuration, operations of the test unit according to an embodiment of the present general inventive concept are as follows.

First, the plurality of electronic components 10 comprising the testing point 5 is mounted on the PCB 20. At this time, a separate testing point is not provided in the PCB 20, so that it is possible to reduce the size of the PCB 20, or it is possible to increase the number of the electronic components 10 mounted on the PCB 20 without increasing a size of the PCB 20, thereby allowing the PCB 20 to have high integration. Further, a user can measure a resistance applied between a pair of testing points 5 through an ohmmeter (not shown). For example, one pair of testing points 5 are randomly selected among the plurality of testing points 5 provided in one active component 11, and then its resistance is measured, thereby testing the electric properties, the connection state, or the like of each active component 11. Further, a pair of electronic components 10 can be selected among the plurality of active components 11 and the plurality of passive components 13, and then its resistance or the like is measured using its testing point 5, thereby testing the connection state between the electric component 10 and the PCB 20. Thus, a user can test the electric properties and the connection state of the electric component 10 through the testing points 5 provided in the electric component 10, and therefore determine whether the electric components 10 and its connection state are defective or not according to the testing results.

Thus, the testing unit according to an embodiment of the present general inventive concept comprises at least one testing point provided on each electronic component in order to test the electric properties and the connection state of the plurality of electric components connected to the PCB, thereby making the PCB have high integration.

The electronic component 10 includes a main body and the main circuit component contained therein using the packaging method, so that the main body, the connection pin, and the testing point 5 may be formed in a monolithic single body. That is, the main body may include a material to seal the main circuit component, and the connection pin 15 and the testing point 5 may include first portions sealed by the material and electrically connected to the sealed main circuit component, and second portions which are not sealed by the material. Accordingly, the main circuit component and the first portions of the connection pin 15 and the testing point 5 are not exposed to an outside of the main body while the second portions of the connection pin 15 and the testing point 5 are exposed to the outside of the main body in different directions.

As shown in FIGS. 1-3, the PCB 20 may include at least one second testing point formed on a printed circuit of the PCB and connected to the connection pin 15 of the electronic component 10 so as to test the electric property and the connection state of the electronic component 10 connected to the printed circuit of the PCB.

As described above, the present general inventive concept provides a test unit usable with a PCB having an electronic component, in which a testing point is provided in the electronic component mounted on the PCB, thereby enhancing high integration of the PCB.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A test unit usable with a board having an electronic component, comprising:
   at least one testing point provided in the electronic component to test an electric property and a connection state of the electronic component connected to the board; and
   a connection pin provided in the electronic component and being electrically connected to the testing point,
   wherein the electric property and the connection state of the electronic component is tested from a side of the electronic component not facing the board.

2. The test unit according to claim 1, wherein the electronic component comprises at least one of an active component having at least three connection pins and a passive component having two connection pins.

3. The test unit according to claim 1, wherein the electronic component comprises a side facing the board, and the testing point is placed on an opposite side to the side of the electronic component.

4. An electronic component, comprising:
   a main body containing a main circuit component;
   a connection pin connected to the main circuit component and exposed to an outside of the main body; and
   at least one testing point formed on a side of the main body opposite to the connection pin, the at least one testing point connected to the main circuit component and the connection pin in electrical continuity, and exposed to an outside of the main body, and an electric property and a connection state of the main body is tested from a side of the main body different than the side on which the connection pin is connected.

5. The electronic component according to claim 4, wherein:
   the main body comprises a first side and a second side;
   the connection pin is extended from the first side of the main body; and
   the at least one testing point is formed on the second side of the main body.

6. The electronic component according to claim 5, wherein the first side and the second side are disposed opposite to each other with respect to the main circuit component.

7. The electronic component according to claim 5, wherein the first side and the second side meet at a 90 degree angle.

8. The electronic component according to claim 4, wherein the connection pin comprises a plurality of connection pins, and the at least one testing point is connected to one or more of the connection pins.

9. The electronic component according to claim 4, wherein:
   the connection pin comprises a plurality of connection pins;
   the at least one testing point comprises one or more testing pins; and
   a number of the connection pins is equal to or greater than a number of the testing pins.

10. The electronic component according to claim 4, wherein the main circuit component is not exposed to the outside of the main body, and the connection pin and the at least one testing point are exposed to the outside of the main body in different directions.

11. The electronic component according to claim 4, wherein the connection pin and the at least one testing point comprise one of a pad, a flat pad, a protruding pin, and a recess formed on the main body.

12. The electronic component according to claim 4, wherein the main body, the connection pin, and the at least one testing point are formed in a monolithic single body.

13. The electronic component according to claim 4, wherein:
   the main body comprises a material to seal the main circuit component;
   the connection pin and the at least one testing point comprise first portions sealed by the material and connected to the sealed main circuit component; and
   the connection pin and the at least one testing point comprise second portions which are not sealed by the material.

14. The electronic component according to claim 4, wherein the at least one testing point comprises a conductive material and a portion surrounding the conductive material.

15. The electronic component according to claim 14, wherein the conductive material is connected to the connection pin, and the portion comprises an opening through which the conductive material is exposed to the outside of the main body.

16. A circuit board, comprising:
   a board connection portion formed on a surface of the circuit board; and
   an electronic component electrically connected to the board connection portion comprising:
   a main body containing a main circuit component,
   a connection pin connected to the main circuit component and exposed to an outside of the main body to be connected to the board connection portion, and
   at least one testing point formed on the main body, connected to the main body and the connecting pin in electrical continuity, and exposed to an outside of the main body provided in the electronic component to test an electric property and a connection state of the electronic component connected to the board,
   wherein the electric property and the connection state of the electronic component is tested from a side of the electronic component not facing the circuit board.

17. The circuit board according to claim 16, further comprising:
   a soldering part formed on the connection pin and the board connection portion to electrically connect the connection pin to the board connection portion,
   wherein the circuit board comprises a printed circuit formed on the surface of the circuit board, and the board connection portion is formed on the printed circuit.

18. The circuit board according to claim 16, wherein the main body of the electronic component comprises a first side facing the surface of the circuit board and a second side on which the at least one testing point is formed.

19. The circuit board according to claim 16, further comprising:
   a printed circuit formed on the surface of the circuit board and connected to the board connection portion which is connected to the electronic component through the connection pin; and
   at least one second testing point formed on the printed circuit of the circuit board and connected to the connection pin of the electronic component so as to test the electric property and the connection state of the electronic component connected to the circuit board.

20. An electronic component being attached to a circuit board, comprising:
- a top side and an opposing bottom side, the bottom side facing the circuit board;
- at least one connection pin exposed to an outside of the electronic component; and
- at least one testing point connected to the at least one connection pin, wherein the at least one testing point is disposed directly on a side of the electronic component not facing the circuit board, and an electric property and connection state of the electronic component is tested from a side of the electronic component not facing the circuit board.

* * * * *